IRRADIATION FOR FAST RECOVERY OF HIGH POWER JUNCTION DIODES

Filed March 8, 1973

United States Patent Office 3,809,582

Patented May 7, 1974

3,809,582

IRRADIATION FOR FAST RECOVERY OF HIGH POWER JUNCTION DIODES

Krishan S. Tarneja, Pittsburgh, and Frank V. Marcinko, Uniontown, Pa., assignors to Westinghouse Electric Corporation, Pittsburgh, Pa.

Filed Mar. 8, 1973, Ser. No. 339,242

Int. Cl. H011 7/00

U.S. Cl. 148—1.5 3 Claims

ABSTRACT OF THE DISCLOSURE

The recovery time of a high power junction diode is substantially reduced and tailored to sepecific specifications while maintaining within nominal ranges other electrical characteristics and particularly the forward voltage drop of the device. The diode is irradiated preferably with electron radiation which preferably has an intensity between about 1 and 3 mev. Further preferred, the electron radiation is applied to a dosage level between about $1 \times 10^{12}$ and $1 \times 10^{14}$ electrons per $cm.^2$.

FIELD OF THE INVENTION

The present invention relates to the making of semiconductor devices and particularly diodes.

BACKGROUND OF THE INVENTION

A semiconductor diode is a two-electrode semi-conductor device, having an anode and a cathode, which has marked unidirectional electrical characteristics. A junction diode is a semiconductor diode whose asymmetrical voltage-ampere characteristics are manifested as a result of a PN junction formed at the transition between N-type and P-type regions within the semiconductor wafer. This junction may be either diffused, grown or alloyed.

A high power diode generally requires that one of the regions, usually the anode region, have a low impurity concentration, e.g., $1 \times 10^{14}$ to $1 \times 10^{16}$ atoms per $cm.^3$. This enables the device to withstand a high reverse blocking voltage without breakdown or punch-through by permitting a wide space charge region. The difficulty with such devices has been the long reverse recovery time upon breakover into the conduction mode. That is, the time needed for the device to reestablish the blocking mode upon break-down or punch-through. Such recovery time is primarily dependent upon the recombination time of the minority carriers in the highly resistive region, which as perviously stated is usually the anode region.

In the past, the recovery time of both low and high power diodes has been reduced by diffusion of gold into the highly resistive region and, in some cases, throughout the semiconductor body. However, gold is notorious for its uncontrollability on diffusion. It is therefore difficult to localize the gold diffusion with any precision within the semiconductor body and/or to provide a uniform gold diffusion within the diffused regions of the body. Gold diffusion has therefore resulted in low quantitative yields, particularly in high power junction diodes. In addition, gold diffusion has been found to increase the leakage current at high temperatures through the PN junction of the diode.

It has been proposed to irradiate semiconductor devices for various reasons. For example, it has been described in patent application Ser. No. 324,718 [W.E. 42,-938], field Jan. 18, 1973, and assigned to the same assignee as the present application, to "bulk" irradiate fast switching thyristors to decrease the turnoff times. See also patent applications Ser. No. 283,684, filed Aug. 25, 1972, Ser. No. 283,685, filed Aug. 25, 1972, Ser. No. 285,165, filed Aug. 31, 1972, Ser. No. 343,070 [W.E. 43,860], filed Mar. 20, 1973, Ser. No. 354,620 [W.E. 43,103], filed Apr. 25, 1973, and Ser. No. 337,967 [W.E. 43,885], filed Mar. 5, 1973, all of which are assigned to the same assignee as the present invention.

However, none of these previously described applicacations for irradiation in semiconductor manufacture involve diodes. To the contrary, the mechanism postulated to occur on irradiation of semiconductor devices teaches that irradiation has utility in semiconductor manufacture only in gated devices to kill the gain of the device, or a portion thereof, to change the electrical characteristics.

SUMMARY OF THE INVENTION

The present invention provides a junction diode semiconductor body in which a recovery time is decreased while maintaining within nominal values other electrical characteristics, particularly forward voltage drop and high temperature leakage currents. The body is positioned with one major surface thereof and most preferably major surface adjoining the cathode region of the device for exposure to a radiation source, and thereafter the device is irradiated by the radiation source.

Electron radiation is preferably used as a suitable radiation source in the irradiation step because of availability and inexpensiveness. However, it is contemplated that any kind of radiation such as proton, neutron, alpha and gamma radiation may be appropriate, provided it is capable of bombarding and disrupting the atomic lattice to create energy levels that substantially increase the recombination rate of the minority carriers without correspondingly increasing the carrier generation rate.

Further, it is preferred that the radiation level of electron radiation be between about 1 mev. and 3 mev. in intensity. Lower level intensity is generally believed to result in substantial elastic collision with the atomic lattice and, therefore, does not provide enough damage to the lattice in commercially feasible times. Conversely, higher intensity radiation is believed to cause too severe lattice damage to the semiconductor crystal to maintain certain other electrical characteristics of the device within nominal values.

It has been found that an electron dosage between about $1 \times 10^{12}$ and $1 \times 10^{14}$ $electrons/cm.^2$ provides suitable radiation dosage. Lower dosage levels have not been found to affect suitable reductions in recovery time. Conversely, radiation dosages above $1 \times 10^{14}$ $electrons/cm.^2$ have not permitted maintenance of other electrical characteristics and specifically the forward voltage drop of the device within marketable values.

Other details, objects and advantages of the invention will become apparent as the following description of the present preferred embodiments and present preferred methods of practicing the same proceeds.

BRIEF DESCRIPTION OF THE DRAWINGS

In the accompanying drawings, the preferred embodiments of the invention and presently preferred methods of practicing the invention are illustrated in which.

DESCRIPTION OF THE PREFERRED EMBODIMENTS

Figure 1:
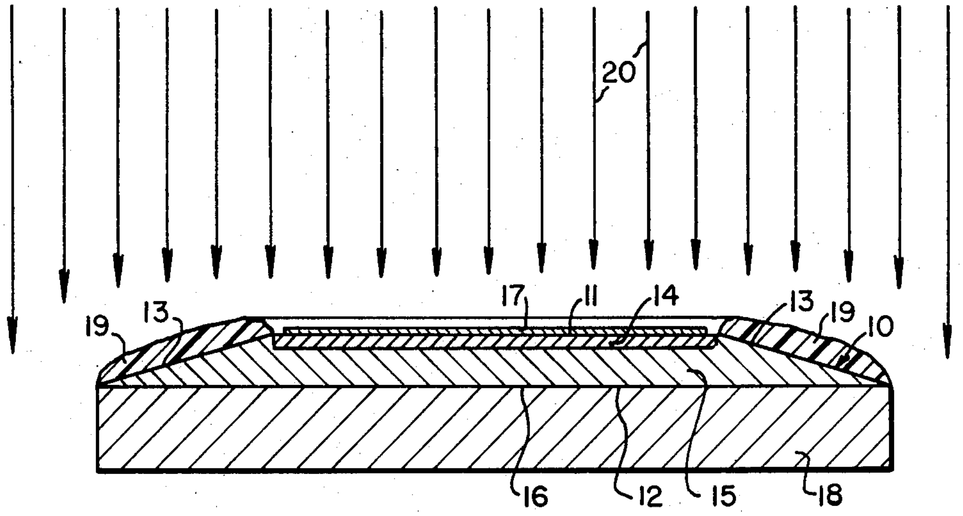
FIG. 1 is an elevational view in cross-section of a high power junction silicon diode being irradiated in accordance with the invention.

Referring to FIG. 1, a junction silicon diode wafer or body 10 is shown having opposed major surfaces 11 and 12 and curvilinear side surfaces 13. Diode body 10 has cathode region 14 and anode region 15 of impurities of opposite conductivity type adjoining major surfaces 11 and 12, respectively. Formed at the transition between regions 14 and 15 in the interior of body 10 is PN junction 16.

To provide electrical connections to the diode body, metal contacts 17 and 18 make ohmic contact to cathode region 14 and anode region 15 at major surfaces 11 and 12, respectively. To reduce channeling effects and atmospheric effects on the diode operation, side surfaces 13 are beveled by lap etching and are coated with a suitable passivating resin 19 such as a silicone, epoxy or varnish composition.

Irradiation is performed on diode body 10 by positioning major surface 11 for exposure to a suitable radiation source. The diode body is thereafter irradiated by radiation 20 from the radiation source to a dosage level sufficient to reduce the reverse recovery time of the device to a desired value.

As stated before, electron radiation is preferred for use as the radiation source because of availability and inexpensiveness. Moreover, electron radiation (or gamma radiation) may be preferred in some applications where the damage desired in the semiconductor lattice is to single atoms and small groups of atoms. This is in contrast to neutron, proton and alpha radiation which causes large disordered regions of as many as a few hundred atoms in the semiconductor crystal. The latter type of radiation may, however, be preferred for the radiation source in certain applications because of its better defined range and better controlled depth of lattice damage.

Electron radiation is also preferred over gamma radiation because of its availability to provide adequate dosages in short periods of time. Suitable dosages of gamma radiation may require several weeks to be applied, while similar dosages of electron radiation can be applied in minutes.

Figure 2:
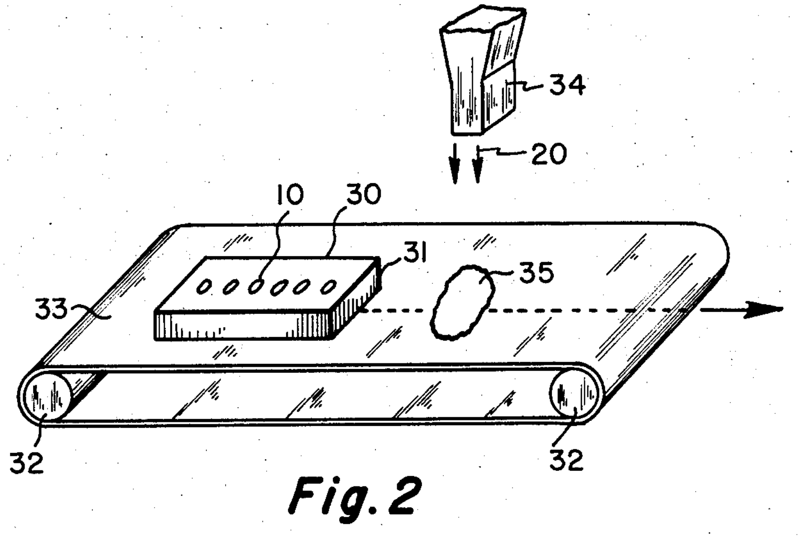
FIG. 2 is a perspective of apparatus for performance of irradiation on a series of junction diodes as shown in FIG. 1.

Referring to FIG. 2, apparatus is shown for performing the irradiation on the junction diode body 10 as shown in FIG. 1 with electron radiation. A conveyor belt 33 is moved around roller or pulley means 32 which is rotated by a suitable power source (not shown). A 2 mev. Van de Graaff Accelerator 34 is positioned to direct electron radiation 20 perpendicular to conveyor belt 33 to strike it at 35.

A series of junction diode bodies 10 are positioned in planar array on a water cooled tray 30 having an electrostatically attractive periphery 31. Bodies 10 are positioned with major surface 11 adjoining cathode region 14 facing upwardly as shown in FIG. 1. To perform the irradiation, the electron dosage rate is measured by use of a Faraday cup in conjunction with an Elcon Charge Integrator and the radiation level adjusted to the desired dosage. Tray 30 with the bodies 10 in place is then placed on the conveyor belt 33 and moved by the conveyor in the direction of the arrow through the electron radiation 20. The radiation dosage can also be controlled by the speed of the conveyor belt 33 as well as the intensity level of the electron radiation.

By the irradiation as shown by FIGS. 1 and 2, the reverse recovery time of a high power junction diode is typically reduced from $8 \pm 1$ microseconds to $2 \pm 0.5$ microseconds, while maintaining other electrical characteristics and particularly the forward voltage drop of the diode within marketable values. As can be appreciated, a wide range of reverse recovery times can be provided as desired by use of the invention. Such desired values for reverse recovery time cannot, however, be arbitrarily chosen. The reduction in reverse recovery time that can be achieved by use of the present invention is limited by the increases in forward voltage drop ($V_F$) and reverse leakage current ($I_L$) (hot) which can be tolerated.

To illustrate the operation of the invention, the electrical characteristics of ten (10) 1600 volt, silicon junction diodes were measured before and after irradiation to various dosage levels. The diodes were N-type having a nominal diameter of 0.875 inch and a nominal thickness of 14 mils. The diffused cathode region has a diameter of about 0.750 inch and a depth of 75 microns with a surface impurity concentration of about $5 \times 10^{19}$ per cm.$^3$. The diodes were irradiated with 2 mev. electron radiation to various dosages from about $2 \times 10^{13}$ to $7 \times 10^{14}$ electrons/cm.$^2$.

A tabulation of the measurements before and after radiation are given in Table I.

TABLE I

| Diode number | Before radiation: $V_R$ at R.T.[a] (volts) | Before radiation: $V_R$ at 150° C.[b] (volts) | Before radiation: $V_F$ at 800 A.[c] (volts) | Before radiation: $t_{rr}$[d] ($\mu$s) | Radiation dosage ($e$/cm.$^2$) | After radiation: $V_R$ (R.T.) (volts) | After radiation: $V_R$ (150° C.) (volts) | After radiation: $V_F$ 800 A. (volts) | After radiation: $t_{rr}$ ($\mu$s) |
|---|---|---|---|---|---|---|---|---|---|
| 1 | 1,600/<1 ma | 1,600/6 ma | 1.16 | 9.5 | $1.95 \times 10^{13}$ | 1,600/<1 ma | 1,600/6 | 1.30 | 2.8 |
| 2 | 1,600/<1 ma | 1,600/6 ma | 1.22 | 9.0 | $1.95 \times 10^{13}$ | 1,600/<1 ma | 1,600/6 | 1.40 | 3.0 |
| 3 | 1,600/<1 ma | 1,600/7 ma | 1.17 | 9.0 | $7.8 \times 10^{13}$ | 1,600/<1 ma | 400/13 | 1.9 | 1.4 |
| 4 | 1,600/<1 ma | 1,600/10 ma | 1.20 | 8.5 | $7.8 \times 10^{13}$ | 1,600/2 ma | 600/10 | 1.9 | 1.5 |
| 5 | 1,600/<1 ma | 1,600/7 ma | 1.18 | 9.0 | $1.56 \times 10^{14}$ | 1,600/<1 ma | 400/12 | 1.9 | 1.0 |
| 6 | 1,600/<1 ma | 1,600/6 ma | 1.13 | 9.0 | $1.56 \times 10^{14}$ | 1,600/<1 ma | 400/12 | (e) | 1.2 |
| 7 | 1,600/<1 ma | 1,600/6 ma | 1.17 | 9.0 | $2.34 \times 10^{14}$ | 1,600/<1 ma | 1,600/10 | (e) | 0.660 |
| 8 | 1,600/<1 ma | 1,600/7 ma | 1.14 | 9.0 | $2.34 \times 10^{14}$ | 1,600/<1 ma | 400/10 | (e) | 0.900 |
| 9 | 1,600/<1 ma | 1,600/6 ma | 1.18 | 8.5 | $2.34 \times 10^{14}$ | 1,600/>10 ma | 200/25 | (e) | 0.660 |
| 10 | 1,600/<1 ma | 1,600/6 ma | 1.20 | 8.5 | $7.02 \times 10^{14}$ | 1,600/<1 ma | 1,600/13 | (e) | 0.480 |

[a] Reverse blocking voltage measured at room temperature.
• Reverse blocking voltage measured at 150° C.
[b] Forward voltage drop measured at room temperature at 800 amps.
[d] Reverse recovery time.
[e] Too high to measure.

As can be seen from Table I, the reverse recovery time can be widely varied depending upon the allowable increase in forward voltage drop ($V_F$) which can be tolerated in the particular application. It can also be seen from the table that the optimum results, keeping in mind the compromises with forward voltage drop ($V_F$) and reverse leakage current ($I_L$) (hot), were achieved by using dosages of about $2 \times 10^{13}$ electrons/cm.$^2$ and $8 \times 10^{13}$ electrons/cm.$^2$.

To further illustrate the operation of the invention, irradiations were performed with forty-five (45) 1200 volt/1600 volt silicon junction diodes. The diodes were N-type having a nominal diameter of 0.914 inch and a nominal thickness of 11 mils. The diffused cathode region has a diameter of about 0.720 inch and a depth of 70 microns with a surface impurity concentration of about $5 \times 10^{19}$ per cm.$^3$. The diodes were irradiated with 2 mev. electron radiation to various radiation dosages of about $8 \times 10^{12}$ or $7 \times 10^{13}$ electrons/cm.$^2$.

The electrical characteristics were measured before and after irradiation. The measurements are tabulated in Table II below.

TABLE II

| Diode number | Before radiation | | | | Radiation dosage ($e$/cm.$^2$) | After radiation | | | |
|---|---|---|---|---|---|---|---|---|---|
| | $V_R$(R.T.)[a] (volts) | $V_R$ at 150° C.[b] (volts) | $V_F$[c] (volts) | $t_{rr}$[d] ($\mu s$) | | $V_R$(R.T.) (volts) | $V_R$(150° C.) (volts) | $V_F$800 a. (volts) | $t_r$ ($\mu s$) |
| 1 | 1,600/15.0 ma | 1,200/62.0 ma | 1.15 | 8.6 | $8\times10^{12}$ | 1,600/1.0 ma | 1,200/2.0 ma | 1.15 | 5.5 |
| 2 | 1,600/4.0 ma | 1,200/2.0 ma | 1.19 | 8.6 | $8\times10_{1}{}^{2}$ | 1,600/<0.1 ma | 1,200/2.0 ma | 1.17 | 5.8 |
| 3 | 1,600/2.0 ma | 1,200/3.0 ma | 1.22 | 8.8 | $8\times10^{12}$ | 1,600/<0.1 ma | 1,200/2.0 ma | 1.20 | 5.5 |
| 4 | 1,600/<0.1 ma | 1,200/3.0 ma | 1.20 | 8.4 | $8\times10^{12}$ | 1,600/<0.1 ma | 1,200/2.0 ma | 1.17 | 5.4 |
| 5 | 1,600/4.0 ma | 1,200/3.0 ma | 1.20 | 8.6 | $8\times10^{12}$ | 1,600/<0.1 ma | 1,200/2.0 ma | 1.17 | 5.5 |
| 6 | 1,600/0.5 my | 1,200/3.0 ma | 1.17 | 8.8 | $8\times10^{12}$ | 1,600/<0.1 ma | 1,200/2.2 ma | 1.19 | ---------- |
| 7 | 1,600/<0.1 ma | 1,200/3.0 ma | 1.18 | 9.0 | $8\times10^{12}$ | 1,600/<0.1 ma | 1,200/2.2 ma | 1.19 | 5.5 |
| 8 | 1,600/1.5 ma | 1,200/3.5 ma | 1.17 | 9.0 | $8\times10^{12}$ | 1,600/<0.1 ma | 1,200/2.2 ma | 1.16 | 5.4 |
| 9 | 1,600/1.5 ma | 1,200/5.0 ma | 1.19 | 9.0 | $8\times10^{12}$ | 1,600/0.5 ma | 1,200/4.0 ma | 1.17 | 5.5 |
| 10 | 1,600/<0.1 ma | 1,200/2.0 ma | 1.16 | 9.4 | $8\times10^{12}$ | 1,600/<0.1 ma | 1,200/2.0 ma | 1.16 | 5.8 |
| 11 | 1,600/<0.1 ma | 1,200/3.0 ma | 1.15 | 9.8 | $8\times10^{12}$ | 1,600/<0.1 ma | 1,200/2.2 ma | 1.15 | 5.5 |
| 12 | 1,540/15.0 ma | 1,200/3.0 ma | 1.19 | 8.8 | $8\times10^{12}$ | 1,550/15.0 ma | 1,200/2.0 ma | 1.16 | 5.4 |
| 13 | 1,480/15.0 ma | 1,200/2.5 ma | 1.17 | 8.8 | $8\times10^{12}$ | 1,480/15.0 ma | 1,200/2.0 ma | 1.16 | 5.4 |
| 14 | 1,600/15.0 ma | 1,200/3.0 ma | 1.17 | 9.0 | $8\times10^{12}$ | 1,600/2.0 ma | 1,200/2.0 ma | 1.16 | 5.5 |
| 15 | 1,600/15.0 ma | 1,200/3.0 ma | 1.20 | 8.8 | $8\times10^{12}$ | 1,600/2.0 ma | 1,200/2.0 ma | 1.16 | 5.5 |
| 16 | 1,480/15.0 ma | 1,200/3.0 ma | 1.20 | 9.2 | $8\times10^{12}$ | 1,480/15.0 ma | 1,200/2.0 ma | 1.18 | 5.4 |
| 17 | 1,420/15.0 ma | 1,200/3.0 ma | 1.18 | 9.6 | $8\times10^{12}$ | 1,420/15.0 ma | 1,200/2.0 ma | 1.18 | 5.8 |
| 18 | 1,400/15.0 ma | 1,200/3.0 ma | 1.21 | 9.0 | $8\times10^{12}$ | 1,400/15.0 ma | 1,200/2.0 ma | 1.19 | 5.4 |
| 19 | 1,400/15.0 ma | 1,200/3.5 ma | 1.19 | 10.2 | $8\times10^{12}$ | 1,400/15.0 ma | 1,200/2.0 ma | 1.16 | 6.0 |
| 20 | 1,500/15.0 ma | 1,200/3.0 ma | 1.20 | 8.6 | $8\times10^{12}$ | 1,500/15.0 ma | 1,200/2.5 ma | 1.17 | 5.0 |
| 21 | 1,360/15.0 ma | 1,200/1.5 ma | 1.19 | 10.2 | $8\times10^{12}$ | 1,360/15.0 ma | 1,200/1.0 ma | 1.16 | 6.0 |
| 22 | 1,520/15.0 ma | 1,200/2.0 ma | 1.20 | 9.0 | $8\times10^{12}$ | 1,520/15.0 ma | 1,200/2.0 ma | 1.18 | 5.4 |
| 23 | 1,600/15.0 ma | 1,200/1.5 ma | 1.20 | 9.2 | $8\times10^{12}$ | 1,600/2.0 ma | 1,200/2.0 ma | 1.18 | 5.7 |
| 24 | 1,440/15.0 ma | 1,200/1.5 ma | 1.19 | 9.6 | $7\times10^{13}$ | 1,440/15.0 ma | 1,200/5.0 ma | 1.62 | 1.7 |
| 25 | 1,460/15.0 ma | 1,200/3.0 ma | 1.17 | 10.0 | $7\times10^{13}$ | 1,460/15.0 ma | 1,200/5.5 ma | 1.60 | 1.8 |
| 26 | 1,540/15.0 ma | 1,200/2.0 ma | 1.17 | 9.4 | $7\times10^{13}$ | 1,540/15.0 ma | 1,200/4.2 ma | 1.62 | 1.7 |
| 27 | 1,440/15.0 ma | 1,200/2.0 ma | 1.24 | 8.2 | $7\times10^{13}$ | 1,420/15.0 ma | 1,200/4.5 ma | 1.75 | 1.7 |
| 28 | 1,560/15.0 ma | 1,200/2.0 ma | 1.23 | 8.4 | $7\times10^{13}$ | 1,600/5.0 ma | 1,200/5.0 ma | 1.76 | 1.8 |
| 29 | 1,480/15.0 ma | 1,200/5.0 ma | 1.18 | 9.6 | $7\times10^{13}$ | 1,480/15.0 ma | 1,200/6.0 ma | 1.63 | 1.8 |
| 30 | 1,500/15.0 ma | 1,200/2.0 ma | 1.18 | 9.4 | $7\times10^{13}$ | 1,500/15.0 ma | 1,200/4.5 ma | 1.62 | 1.7 |
| 31 | 1,500/15.0 ma | 1,200/1.5 ma | 1.22 | 8.0 | $7\times10^{13}$ | 1,500/15.0 ma | 1,200/4.5 ma | 1.76 | 1.7 |
| 32 | 1,460/15.0 ma | 1,200/3.0 ma | 1.22 | 8.6 | $7\times10^{13}$ | 1,460/15.0 ma | 1,200/5.2 ma | 1.75 | 1.7 |
| 33 | 1,540/15.0 ma | 1,200/2.0 ma | 1.21 | 8.6 | $7\times10^{13}$ | 1,540/15.0 ma | 1,200/5.0 ma | 1.68 | 1.7 |
| 34 | 1,560/15.0 ma | 1,200/5.0 ma | 1.19 | 9.0 | $7\times10^{13}$ | 1,560/15.0 ma | 1,200/6.0 ma | 1.68 | 1.7 |
| 35 | 1,560/15.0 ma | 1,200/5.0 ma | 1.20 | 9.4 | $7\times10^{13}$ | 1,600/5.0 ma | 1,200/7.5 ma | 1.68 | 1.7 |
| 36 | 1,340/15.0 ma | 1,200/3.0 ma | 1.16 | 10.0 | $7\times10^{13}$ | 1,340/15.0 ma | 1,200/5.5 ma | 1.61 | 1.7 |
| 37 | 1,400/15.0 ma | 1,200/3.0 ma | 1.17 | 9.8 | $7\times10^{13}$ | 1,400/15.0 ma | 1,200/5.0 ma | 1.68 | 1.8 |
| 38 | 1,460/15.0 ma | 1,200/3.5 ma | 1.17 | 8.4 | $7\times10^{13}$ | 1,460/15.0 ma | 1,200/6.0 ma | 1.64 | 1.7 |
| 39 | 1,400/15.0 ma | 1,200/3.0 ma | 1.18 | 8.6 | $7\times10^{13}$ | 1,400/15.0 ma | 1,200/5.0 ma | 1.64 | 1.7 |
| 40 | 1,500/15.0 ma | 1,200/3.0 ma | 1.18 | 8.6 | $7\times10^{13}$ | 1,500/15.0 ma | 1,200/5.0 ma | 1.67 | 1.7 |
| 41 | 1,400/15.0 ma | 1,200/5.0 ma | 1.18 | 9.8 | $7\times10^{13}$ | 1,400/15.0 ma | 1,200/7.0 ma | 1.65 | 1.7 |
| 42 | 1,520/15.0 ma | 1,200/3.0 ma | 1.21 | 8.8 | $7\times10^{13}$ | 1,520/15.0 ma | 1,200/5.0 ma | 1.65 | 1.7 |
| 43 | 1,440/15.0 ma | 1,200/3.0 ma | 1.21 | 8.8 | $7\times10^{13}$ | 1,440/15.0 ma | 1,200/5.0 ma | 1.63 | 1.8 |
| 44 | 1,520/15.0 ma | 1,200/3.0 ma | 1.21 | 8.6 | $7\times10^{13}$ | 1,500/15.0 ma | 1,200/5.0 ma | 1.67 | 1.8 |
| 45 | 1,600/15.0 ma | 1,200/4.0 ma | 1.18 | 9.2 | $7\times10^{13}$ | 1,600/5.0 ma | 1,200/5.0 ma | 1.60 | 1.8 |

[a] Reverse blocking voltage measured at room temperature.
[b] Reverse blocking voltage measured at 150° C.
[c] Forward voltage drop measured at room temperature at 800 amps.
[d] Reverse recovery time.

It is again seen from Table II that the reverse recovery time can be substantially reduced without significantly increasing forward voltage drop by use of the present invention.

In order to check the stability of the devices with temperature, the irradiated diodes Nos. 1 and 2 of Table I were annealed at 250° C. for a period of 400 hours. Their electrical characteristics were measured at 64 hours and again at 400 hours. A compilation of those measurements is shown in Table III below.

TABLE III

| Diode No. | Annealing time at 250° C. (volts) | $V_R$ at R.T.[1] (volts) | $V_R$ at 150° C.[2] (volts) | $V_F$ at 300 a.[3] (volts) | $t_{rr}$[4] ($\mu s$) |
|---|---|---|---|---|---|
| 1 | After 64 hrs | 1,600/<1 ma | 1,600/6 ma | 1.28 | 2.8 |
| 2 | do | 1,600/<1 ma | 1,600/6 ma | 1.40 | 2.8 |
| 1 | After 400 hrs | 1,600/<1 ma | 1,600/7 ma | 1.26 | 3.0 |
| 2 | do | 1,600/<1 ma | 1,600/5 ma | 1.36 | 3.0 |

[1] Reverse blocking voltage measured at room temperature.
[2] Reverse blocking voltage measured at 150° C.
[3] Forward voltage drop measured at 800 amps.
[4] Reverse recovery time.

As the data from Table III shows, there was no appreciable change in the electrical characteristics, and it was concluded that the invention resulted in diodes that were quite stable and maintained their characteristics even at high temperatures (i.e., up to a maximum of 250° C.).

While presently preferred embodiments have been shown and described, it is distinctly understood that the invention may be otherwise variously performed within the scope of the following claims. For example, the invention has been particularly described with respect to silicon semiconductor devices. It is contemplated that the present invention has utility with other semiconductor materials such as germanium and gallium arsenide, although the particular radiation and intensity thereof and the effectiveness of the invention will doubtless vary with the semiconductor material.

What is claimed is:

1. A method of reducing the reverse recovery time of a junctioned diode comprising the steps of:

(a) positioning a junction diode semiconductor body with a major surface thereof to be exposed to a radiation source; and (b) thereafter irradiating the diode semiconductor body with the radiation source to a dosage level between about $1 \times 10^{12}$ and $1 \times 10^{14}$ electrons/cm.$^2$ to reduce the reverse recovery time of the device.

2. A method of reducing the reverse recovery time of a junctioned diode as set forth in claim 1 wherein: the radiation source of step (b) is electron radiation.

3. A method of decreasing the recovery time of a junctioned diode as set forth in claim 2 wherein: the electron radiation has an intensity between about 1 mev. and 3 mev.

References Cited

UNITED STATES PATENTS

| | | | |
|---|---|---|---|
| 3,691,376 | 9/1972 | Bauerlein | 250—398 |
| 3,654,459 | 4/1972 | Coleman | 250—398 |

JAMES W. LAWRENCE, Primary Examiner

B. C. ANDERSON, Assistant Examiner

U.S. Cl. X.R.

250—398, 400